United States Patent
Kundaliya et al.

(10) Patent No.: US 10,487,390 B2
(45) Date of Patent: Nov. 26, 2019

(54) METHOD OF BONDING A LASER ACTIVATED REMOTE PHOSPHOR ASSEMBLY, METHOD OF MANUFACTURE AND A LASER ACTIVATED REMOTE PHOSPHOR ASSEMBLY

(71) Applicant: OSRAM GmbH, Munich (DE)

(72) Inventors: Darshan Kundaliya, Beverly, MA (US); David W. Johnston, Kensington, NH (US); James A. Avallon, Beverly, MA (US); Alan L. Lenef, Belmont, MA (US)

(73) Assignee: OSRAM GmbH, Munich (DE)

( * ) Notice: Subject to any disclaimer, the term of this patent is extended or adjusted under 35 U.S.C. 154(b) by 333 days.

(21) Appl. No.: 15/455,155

(22) Filed: Mar. 10, 2017

(65) Prior Publication Data

US 2018/0258520 A1    Sep. 13, 2018

(51) Int. Cl.
| | |
|---|---|
| *H01L 33/50* | (2010.01) |
| *C23C 14/28* | (2006.01) |
| *C23C 14/08* | (2006.01) |
| *C23C 14/58* | (2006.01) |
| *H01S 5/00* | (2006.01) |

(52) U.S. Cl.
CPC .............. *C23C 14/28* (2013.01); *C23C 14/08* (2013.01); *C23C 14/5806* (2013.01); *H01L 33/507* (2013.01); *H01L 2933/0041* (2013.01); *H01S 5/005* (2013.01)

(58) Field of Classification Search
CPC ...... C23C 14/28; C23C 14/08; C23C 14/5806; H01S 5/005; H01L 33/507; H01L 2933/0041
See application file for complete search history.

(56) References Cited

U.S. PATENT DOCUMENTS

| | | | |
|---|---|---|---|
| 8,890,140 B2 | 11/2014 | Eberhardt et al. | |
| 2014/0151729 A1* | 6/2014 | Orsley | H01L 33/505 257/98 |
| 2019/0186711 A1* | 6/2019 | Lenef | G03B 21/204 |

OTHER PUBLICATIONS

O. Ogbuu et al.; Impact of Stoichiometry on Structural and Optical Properties of Sputter Deposited Multicomponent Tellurite Glass Films; The American Ceramic Society; Jun. 2015; pp. 1731-1738; vol. 98, No. 6.

T. Hayakawa et al.; 2) Optical Properties of TeO2—TiO2 Thin Films Doped With Eu3+ IONS Fabricated by SOL-GEL Processing; Journal of the University of Chemical Technology and Metallurgy; Mar. 12, 2012; pp. 381-386; vol. 47, No. 4.

\* cited by examiner

*Primary Examiner* — Mohammed R Alam (57) ABSTRACT

A method for producing a laser activated remote phosphor (LARP) sub-assembly, which may comprise: preparing a target composed of a material; activating the target such that the material is released from the target; directing the material released from the target in the direction of a wavelength converter and depositing the material released from the target onto a major surface of the wavelength converter creating a bonding film.

15 Claims, 6 Drawing Sheets

| Target composition 610 | | | Bonding layer composition 650 | | |
|---|---|---|---|---|---|
| Element | Wt % | At % | Element | Wt % | At % |
| O K | 18.77 | 57.53 | O K | 17.9 | 55.47 |
| ZnL | 11.38 | 8.53 | ZnL | 10.15 | 7.7 |
| NaK | 3.44 | 7.34 | NaK | 4.53 | 9.78 |
| AlK | 0.76 | 1.38 | AlK | 0.58 | 1.06 |
| TeL | 65.65 | 25.22 | TeL | 66.84 | 25.98 |
| Total | 100.00 | 0 | Total | 100.00 | 0 |

METHOD OF BONDING A LASER ACTIVATED REMOTE PHOSPHOR ASSEMBLY, METHOD OF MANUFACTURE AND A LASER ACTIVATED REMOTE PHOSPHOR ASSEMBLY

TECHNICAL FIELD

Various embodiments relate generally to a method of bonding a laser activated remote phosphor assembly, a method of manufacturing laser activated remote phosphor assemblies, and a laser activated remote phosphor assembly.

BACKGROUND

In current Laser Activated Remote Phosphor (LARP) applications, glass is deposited on a ceramic converter or a dichroic coated substrate by liquid glass dosing. Alternatively, a microgram sized fragment may be cut from a thin glass fiber and heated until the fiber melts. In both processes, the glass must remain melted from the time of deposition through final assembly, due to the large difference in the coefficient of thermal expansion (CTE) between the glass versus the dichroic coated substrate and the ceramic converter. With the large difference in CTE between the glass and the material it is bonded to, the glass may spall off upon cooling. This requires the glass dosing process, which is inherently difficult to maintain and control, to be an integral part of the assembly. Any difficulty with dosing requires a shut-down of production.

For the liquid dosing process, control over bubbles in the glass fiber dosing process, weight control, contamination and special registering (correct location for glass) are inherently difficult. It should be noted that the Te—Ze—Al—Na-Oxide glass is very susceptible to reduction, resulting in dark glass and bubbles when contaminated with organic matter. Experience with liquid dosing and cut fiber dosing has shown large variations in glass thickness at the bonding interface.

Alternatively, a drop-cast method, or dispensing method, has been used where liquid glass droplets may be used to form a bonding film between a wavelength converter and dichroic layer for LARP applications. Optical fibers may be cut into tiny microgram pieces and melted onto the carrier substrate before or during the bonding process of the converter platelets. Such process, however, along with being slow, could give non-uniform thickness within the bonding area if not optimized.

BRIEF SUMMARY

Aspects of the disclosure relate to a method of manufacture which is capable to improve production quality and production time of laser-activated remote phosphor (LARP) assemblies.

Enhanced optical and thermal interface between wavelength converters and a LED or dichroic material by thin film deposition of Te—Zn—Al—Na-Oxide glass compositions may advantageously allow for a high speed and high quality manufacturing process.

Thin films of glass composition Te—Zn—Al—Na-Oxide may be deposited on wavelength converters as a substrate using a pulsed laser deposition (PLD) method. A target of composition Te—Zn—Al—Na-Oxide having a diameter of 1 inch and a thickness of $1/8^{th}$ inch may be prepared using a melt quenching method using stoichiometric bulk glass of the same composition. Thin film deposition parameters may be varied by factors such as oxygen partial pressure, laser energy density, deposition time, and temperature, etc., in order to optimize the quality of thin films on wavelength converter platelets. After deposition, the platelets may advantageously be annealed at various temperatures in ambient oxygen in a furnace, such as a Rapid Thermal Annealing (RTA) furnace. This post-annealing process is to compensate for oxygen deficiencies in the as-deposited films. The resultant films may be bonded to a dichroic coated sapphire substrate at ~500 C and 18N pressure. Optical bond layer defect analysis ("Green chuck"), laser power versus lumen performance ("power series") and laser power dependent increase in temperature of LARP assembly measurements may be carried out to evaluate bonding properties.

Green chuck analysis may be carried out by using a narrow band filter such that the light which passes through the bonded LARP assembly, including optical films such as dichroics if used, is illuminated in the green spectrum. Such illumination may allow visible defects to be displayed on the LARP assembly surface in the form of dark spots, interference fringe discontinuities (contrast and phase), or areas with distinct contrast features.

Power series measurements may measure the blue input power versus the amount of lumens output from the LARP assembly.

Thermal measurements may also be carried out to determine the input power versus the maximum temperature reached by the LARP assembly.

The method is advantageous as it may allow for an ultra-thin bond surface, or nanobonding in bonding converters to LEDS and LARP related applications. This method also has the advantage of creating a uniform bond thickness which is optimal for better heat dissipation. There also may be uniform or consistent quality of the bonding film from part-to-part in manufacturing. The use of thin film vacuum technology is advantageous for obtaining a high quality optical interface, e.g. transparency. By eliminating the drop-cast methodology, or dispension, where quality control of the drop has variations from part-to-part in the manufacturing process, the present method has the ability to separate the glass dosing operation from the assembly operation so the quality of the glass dosing operation can be inspected and/or verified. No shutdown of the assembly operation due to difficulties in the dosing operation may be necessary. The thin film bonding method also advantageously reduces or eliminates contamination on the glass and the bubbles in the bonded glass.

In accordance with the above, and consistent with aspects of the disclosure, a method for producing a laser activated remote phosphor (LARP) sub-assembly may include preparing a thin film depositing target composed of a material; activating the target such that the material may be released from the target; directing the material released from the target in the direction of a wavelength converter and depositing the material released from the target onto a major surface of the wavelength converter creating a bonding film. The method may further comprise applying a substrate to the bonding film on the side opposite the wavelength converter to form a LARP assembly.

The target may be prepared using a melt quenching method where the material is composed of a stoichiometric bulk glass, e.g. Te—Zn—Al—Na-Oxide. At least a portion of the material from the target may be vaporized using an activation source. The activation source may raster the target, releasing material. The material released from the target by the activation source may be composed of a material substantially similar to the material of the target. The target is kept rotating during activation.

The wavelength converter may be mounted to a heating stage before depositing material and may be rotated during deposition, wherein the wavelength converter may be rotated at a rate faster than the target during deposition, for example, 100 rpm.

The activation source may be, by way of example but not limited to, a pulsed laser, an electron beam, chemical vapor, a metal-organics vapor phase, an electrical heating element, high energy particles, an ion beam or a laser.

The material of the target deposited onto the wavelength conversion layer may be deposited in oxygen at a partial pressure, where the partial pressure may, for example, range from $1 \times 10^{-6}$ Torr to 400 mTorr to 1 Torr or to 760 Torr. Further, the deposition of the bonding film onto the wavelength converter may occur at room temperature.

Additionally, the method may further comprise annealing the wavelength converter with the deposited bonding film. The wavelength converter with the bonding film may be annealed in a furnace, for example, at temperatures ranging from 300° C. to 700° C. for a length of 0.5-10 min. Annealing may compensate for oxygen deficiency in the wavelength converter with the bonding film.

The wavelength converter with the deposited bonding film may be heated before applying the substrate, for example, at 500° C. The substrate may be applied at a pressure of 18 N.

In a further variation, the substrate may be coated with a dichroic layer before applying the substrate to the bonding film. The substrate may be applied to the bonding film where the dichroic layer is positioned between the bonding film and the substrate.

In accordance with the above, and consistent with aspects of the disclosure, the method of manufacturing a plurality of laser activated remote phosphor (LARP) sub-assemblies may comprise activating the targets such that the material is released from the targets; directing the material released from the targets in the direction of a plurality of wavelength converters; and depositing the material released from the target onto a major surface of the wavelength converters creating a bonding film. The method may further comprise applying a substrate to the bonding film on the side opposite each wavelength converter to form a LARP assembly.

The targets may be prepared using a melt quenching method. The material of the target may be composed of a stoichiometric bulk glass, for example, Te—Zn—Al—Na-Oxide. At least a portion of the material from the targets may be activated using an activation source. The material released from the target by the activation source may be composed of a material substantially similar to the material of the target. Further the target may be rotated during activation.

The wavelength converters may be mounted to a heating stage and may rotate during deposition. The wavelength converters may be rotated at a rate faster than the target is rotated during deposition.

The activation source may be rastered on the target, and may consist of, by way of example, a pulsed laser, an electron beam, an electrical heating element, high energy particles, an ion beam or a laser.

The material released from the target may be deposited in oxygen at a partial pressure, wherein the partial pressure may range from $1 \times 10^{-6}$ Torr to 760 Torr and be at room temperature. An advantageous partial pressure is in the range of 400 mTorr to 1 Torr.

Additionally, the method may further comprise annealing the wavelength converters with the deposited bonding film. The wavelength converters with the bonding film may be annealed in a furnace, by way of example, at temperatures ranging from 300 C to 700 C for a length of 0.5-10 min. Annealing may compensate for oxygen deficiencies in the wavelength converters with the bonding film.

In a further variation, the method may comprise coating the substrates with a dichroic layer and applying the substrates to the bonding film wherein the dichroic layer is positioned between the bonding film and the substrate.

The wavelength converters with the deposited bonding film may be heated before applying the substrates. The substrates may be applied, for example, at a pressure of 18 N and at a temperature of 500° C.

The method may further comprise inspecting the wavelength converters with the bonding film following deposition, for example, for dark spots, bubbles and quality. The wavelength converters with the bonding film may be cooled during the inspection.

Further, the method may comprise heating the wavelength converters with the bonding film to a predetermined temperature before applying the substrates and applying the substrates to the bonding film when the predetermined temperature has been reached.

In accordance with the above, and consistent with aspects of the disclosure, a LARP sub-assembly may comprise a wavelength converter and a bonding film deposited onto a major surface of the wavelength converter using a deposition method. The LARP assembly may further comprise a substrate, which is bonded to the wavelength converter via the bonding film which forms a LARP assembly, and an example of the composition of the substrate is sapphire. The substrate may be bonded to the side of the bonding film opposite the wavelength converter, wherein the bonding film may advantageously be 500-600 nm thick and 450 nm thick along the fracture surface.

The LARP assembly may further comprise a dichroic coating on the substrate between the substrate and the bonding film. The bonding film composition may be advantageously adapted to match the index of refraction to that of the dichroic coating.

The LARP sub-assembly wherein the wavelength converter may be, for example, a prefabricated platelet, ceramic, or phosphor dispersed in a base material.

The LARP sub-assembly wherein the bonding film may be composed of a low temperature glass composition. The bonding film may be composed of bulk glass, for example, Te—Zn—Al—Na-Oxide.

BRIEF DESCRIPTION OF DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "plural" and "multiple" are used herein to expressly refer to a quantity greater than one. Accordingly, any phrases explicitly invoking the aforementioned words (e.g. "a plurality of [objects]", "multiple [objects]") referring to a quantity of objects is intended to expressly refer more than one of the said objects. The terms "group", "set", "collection", "series", "sequence", "grouping", "selection", etc., are used herein to mean a quantity equal to or greater than one, i.e. one or more. Accordingly, the phrases "a group of [objects]", "a set of [objects]", "a collection of [objects]", "a selection of [objects]", "[object] group, "[object] set", "[object] collection", "[object] series", "[object] sequence", "[object] grouping", "[object] selection", etc., used herein in relation to a quantity of objects is intended to refer to a quantity of one or more of said objects. It is appreciated that unless directly referred to with an explicitly stated plural quantity (e.g. "two [objects]", "three of the [objects]", "ten or more [objects]", "at least four [objects]", etc.) or express use of the words "plural", "multiple", or similar phrases, references to quantities of objects are intended to refer to one or more of said objects.

A laser activated remote phosphor (LARP) target may alternatively be referred to as a LARP target or LARP assembly. The terms may be used interchangeably.

Melt-quench method is defined as the method in which an amorphous material, e.g. glass, is cooled quickly from a molten form to a solid form.

Figure 1:
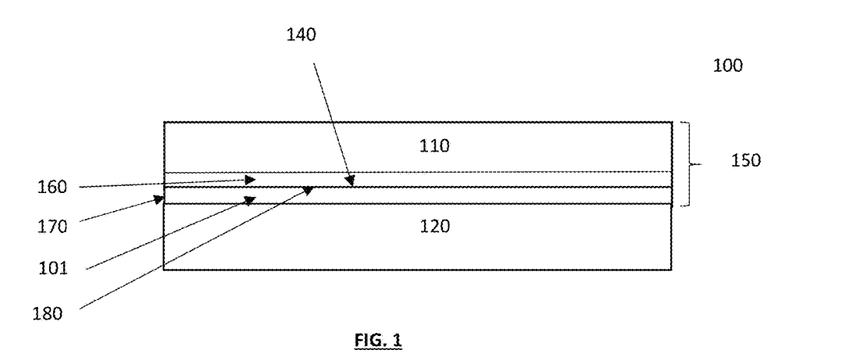
FIG. 1 shows a laser activated phosphor target with a bonding film deposited on a wavelength converter.

FIG. 1 shows a laser activated remote phosphor (LARP) assembly 100. LARP assembly 100 is comprised of LARP sub-assembly 150. Sub-assembly 150 may be comprised of wavelength converter or light conversion layer 110, and bonding film or bonding film 101. Bonding film 101 may be a film or layer which has been directly deposited onto wavelength converter 110, using a thin film deposition method. However, bonding film 101 may also be a layer deposited onto intervening layer 160 on wavelength converter 110. For example, wavelength converter 110 may additionally be comprised of a scattering layer, encapsulation layer and/or another advantageous layer or layers deposited onto wavelength converter 110. For convenience, the deposited bonding film 101 is referred to as being deposited onto wavelength converter 110, but it should be noted that additional intervening layers 160 may be included between wavelength converter 110 and bonding film 101.

Wavelength converter 110, is advantageously, at least partially transparent, translucent or transmissive to light, such that excitation light entering wavelength converter 110 may pass into the wavelength converter 110, either passing through without interaction or striking the phosphor within the wavelength converter 110, causing wavelength converter 110 to emit light of a different wavelength.

Wavelength converter 110 may be in the form of a prefabricated and/or ceramic platelet. Typical dimensions range form 0.25-5 mm in diameter and 25-300 µm thick. Or, alternatively, wavelength converter 110 may be comprised of a phosphor powder dispersed in a base material, i.e. glass or silicone. Wavelength converter 110 may alternatively be in the form of a thin film. Typical dimensions may range from 0.05 mm in diameter and 5 µm to 24 µm thick.

The thickness of bonding film 101 may be kept advantageously thin using thin film deposition methods, and may range between 500-600 nm on the surface 180 and 450 nm at the fracture surface 170, or edge of wavelength converter 110, for optimal thickness. However, this thickness range may vary from 10 nm to 5 µm depending on the surface roughness of wavelength converter 110. Bonding film 101 may be advantageously composed of a low temperature glass material. A low temperature glass may prevent adverse effects or diffusion into wavelength converter 110. Such low temperature bonding materials prevent damage to the dichroic or LED, which would occur if the glass bonding temperatures were at temperature of >600° C.-700° C. for example. A possible composition of bonding film 101 may be Te—Zn—Al—Na-Oxide.

Additionally, the LARP assembly may be comprised of a substrate 120. Substrate 120 may be situated on bonding film 101 to the side opposite the wavelength converter 110. For instance, bonding film 101 may be situated between wavelength converter 110 and substrate 120. Substrate 120 may be comprised of a transmissive material, e.g. sapphire, for a transmissive configuration or alternatively, a reflective material for a reflective configuration.

Figure 2:
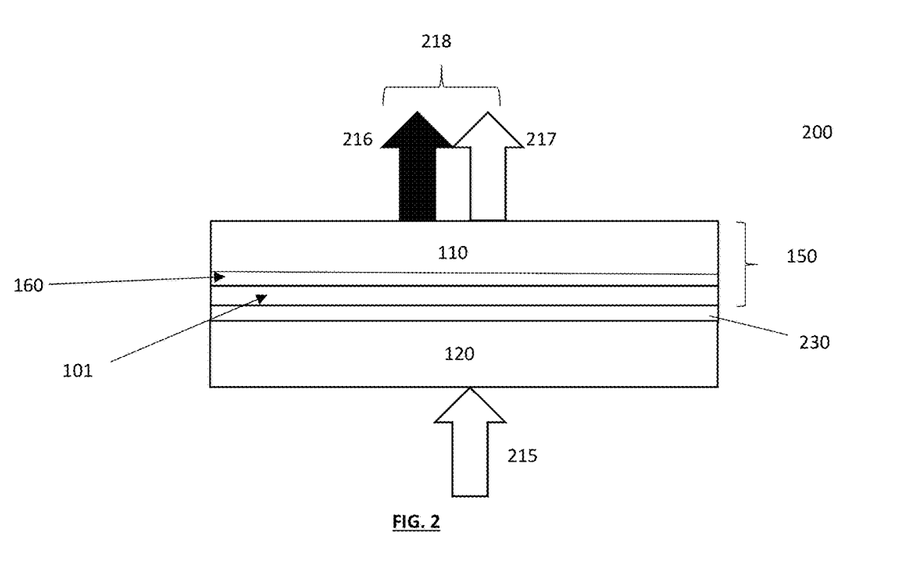
FIG. 2 shows a laser activated phosphor target with a bonding film deposited on a wavelength converter including a dichroic layer on the substrate.

In an alternative configuration of substrate 120, FIG. 2 shows dichroic layer 230 or film or coating on substrate 120. Dichroic layer 230 may be alternatively applied to bonding film 101 such that dichroic layer 230 is positioned between substrate 120 and wavelength converter 110. The composition of bonding film 101 may be adapted such that optimal bonding occurs between dichroic layer 230 and wavelength converter 110. The composition of bonding film 101 may also be adapted such that an optimal index of refraction match occurs to dichroic layer 230 and wavelength converter 110.

The additional feature of a dichroic layer is advantageous where light converted light emitted from wavelength converter 110 is emitted in a backwards direction, e.g. in the direction of dichroic layer 230 from wavelength converter 110. The emitted light may be reflected from dichroic layer 230 in the forward direction, e.g. from dichroic layer 230 back towards wavelength converter 110. Dichroic layer 230 permits recapture of lost light.

Typically, light from wavelength converter 110 is emitted at a plurality of angles. More particularly, light may be emitted in a forward and backward direction or omni-directionally at a plurality of angles relative the normal of wavelength converter 110. If the wavelength converter and its bounding surface have low scattering, the light emission may be isotropic. In more typical applications, wavelength converter 110 contains many scattering particles (or pores) dispersed throughout the volume. The changes in the light distribution inside wavelength converter 110 approaches a Lambertian distribution in the forward and backward directions.

FIG. 2 shows a transmissive configuration for LARP assembly 200. For a transmissive configuration, excitation radiation 215 may enter LARP assembly 200 through transparent substrate 120, dichroic layer 230 and bonding film 101 to reach wavelength converter 110. Excitation radiation 215 may exit wavelength converter 110 substantially converted light emission 216. Alternatively, the excitation radiation 215 may be partially converted in wavelength converter along with an unconverted light emission 217 which has substantially the same wavelength as excitation radiation 215. Converted light emission 216 and unconverted light emission 217 may combine to form mixed light emission 218, even white light.

Figure 3:
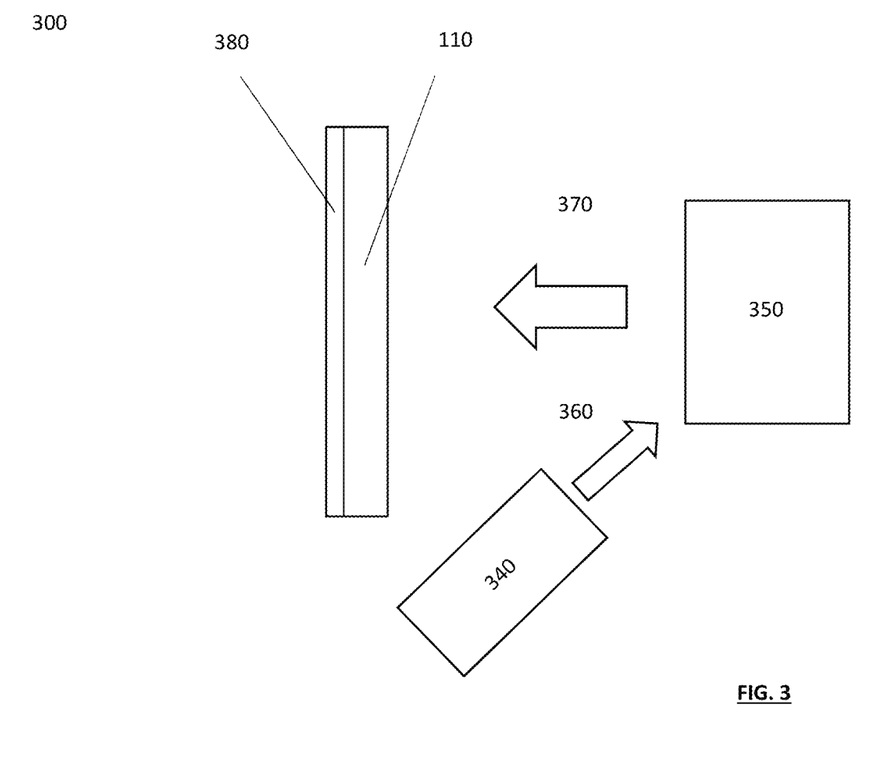
FIG. 3 shows a deposition method assembly.
Figure 4:
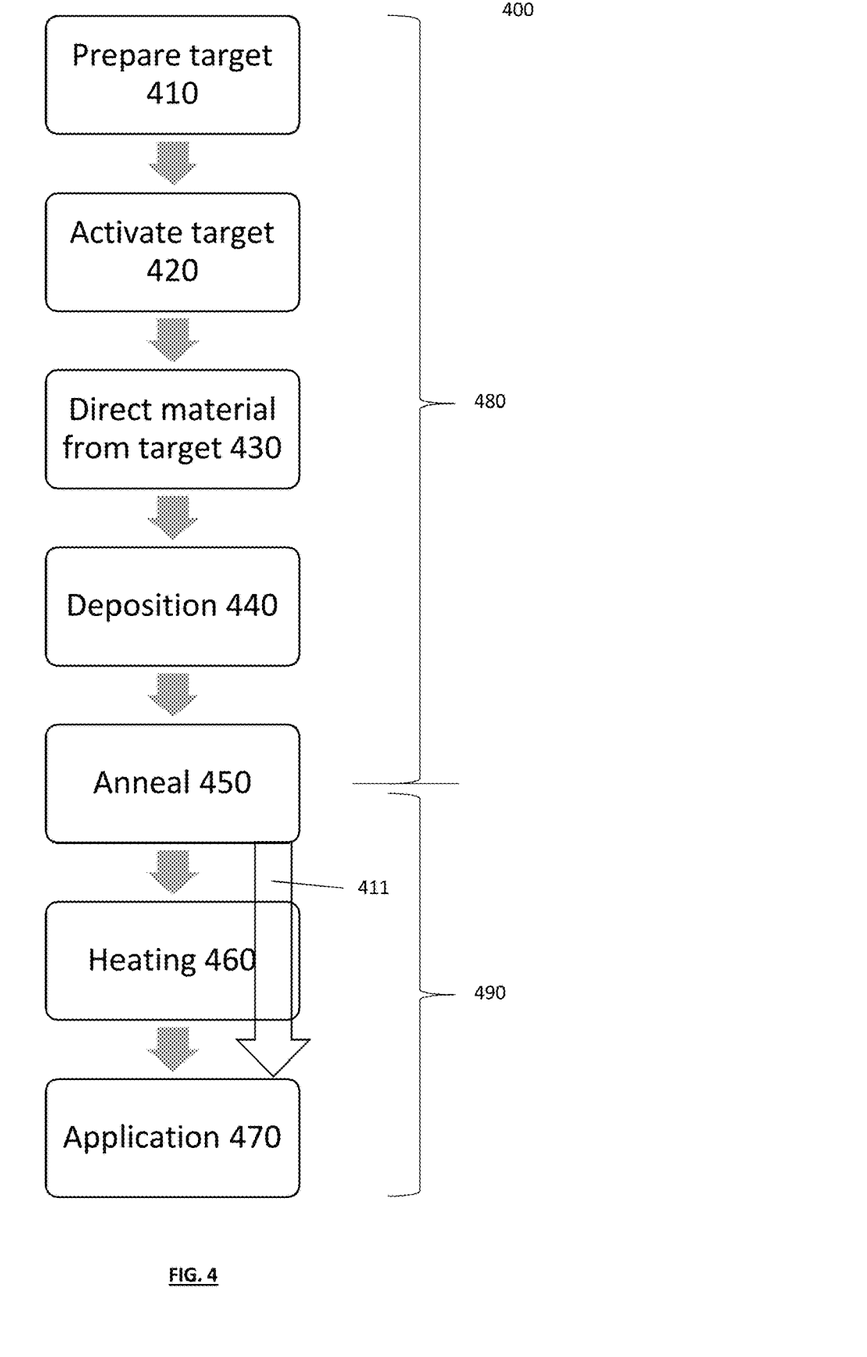
FIG. 4 shows a method for bonding a laser activated remote phosphor assembly.

A method for producing LARP assembly 100 as shown in FIG. 1 is illustrated in FIGS. 3 and 4. In particular, the LARP assembly 100 of FIG. 1 is illustrated as a progression of layers which may be assembled using a deposition method. The production method 400 may be broken up into two parts, 480 and 490. The first portion 480 of method 400, may be considered relevant to producing a LARP sub-assembly. The second portion 490 of method 400 may be considered the fabrication of the LARP assembly including the sub-assembly.

One possible configuration of the first portion 480 of method 400 for sub-assembly 150 (FIG. 1) set-up 300 is shown in FIG. 3. Target 350 may be prepared 410 using, for example but not limited to, a melt-quench method, spark plasma sintering (SPS), high pressure sintering (HPS) or pressureless sintering for preparing targets from precursor materials, i.e. tellurium oxide, zinc oxide, aluminum oxide and sodium carbonates or oxides. Target 350 may have a composition of a stoichiometric bulk glass. A possible composition of the bulk glass may include Te—Zn—Al—Na-Oxide. Sample dimensions of target 350 may, for example, be a diameter of 1 inch and a thickness of $\frac{1}{8}^{th}$ inch, however, the dimensions of target 350 are not limited to these dimensions.

Target 350 may be activated 420 using activation source 340. Atoms from target 350 may at least partially be released from target 350. Target 350 may be activated 420 such that material 370, or atoms thereof, are released through various means, i.e. sputtering or vaporizing. There are many known methods for activation. Examples are to follow, however, the method of activation is not limited to these examples.

Activation 420 may occur through thermal evaporation, which involves heating the target 350, or solid material, inside a vacuum chamber until target 350 begins to boil and evaporates producing an increased vapor pressure. The evaporated material, or vapor steam, may traverse the chamber in a gas phase.

Electron beam physical vapor deposition (e-beam deposition) activates 420 target 350 by bombarding target 350 with an electron beam given off by an activation source 340 which is generally a charged tungsten filament under high vacuum. The e-beam causes atoms from target 350 to transform into the gaseous phase.

Sputtering involves the bombardment of target 350 with high energy particles. Atoms are sputtered, or eroded, off target 350 by a collision of inert gas atoms, usually Argon plasma. The sputtered atoms may be ejected into the gas phase and tend to deposit on all surfaces of a vacuum chamber. Wavelength converter 110 may be placed in the vacuum chamber to be coated with a thin film.

Pulsed electron deposition (PED) is a process in which a pulsed (~100 ns) high power electron beam penetrates into target 350 resulting in a rapid evaporation of target 350 material into a plasma state.

Ion beam-assisted deposition (IBAD) is a technique in which an ion source directs a dispersed beam with a range of energies toward wavelength converter 110. The ion source typically works along with high energy particles for sputtering or an electron beam source. An inert gas such as argon may also be used. IBAD has the advantage of creating a higher-density coating or bonding film 101 with minimal water absorption Pulsed laser deposition (PLD) is a technique in which a high-power pulsed laser beam is focused inside a vacuum chamber to strike target 350. Material 370 is vaporized from target 350 in a plasma plume, which in turn may be deposited onto wavelength converter 110. PLD may occur in ultra-high vacuum or in the presence of a background gas, such as oxygen.

Material 370 released from target 350 is directed 430 from the direction of target 350 toward wavelength converter 110. Wavelength converter 110 is placed such that it is in the line of "sight" or in the path of material 370. This method of depositing bonding film 101 advantageously gives bonding film 101 a uniform distribution with the added advantage of control over the amount of material 370 released form target 350 and ultimately deposited 440 onto wavelength converter 110.

Material 370 may be deposited 440 onto wavelength converter 110, however material 370 may also alternatively be deposited onto intervening layer 140 on wavelength converter 110. Deposition 440 of material 370 may be applied to any layer disposed onto wavelength converter 110. Advantageous parameters for deposition may consist of a deposition time of 90 min which may allow for a coating thickness of approximately 500-600 nm.

Figure 6:
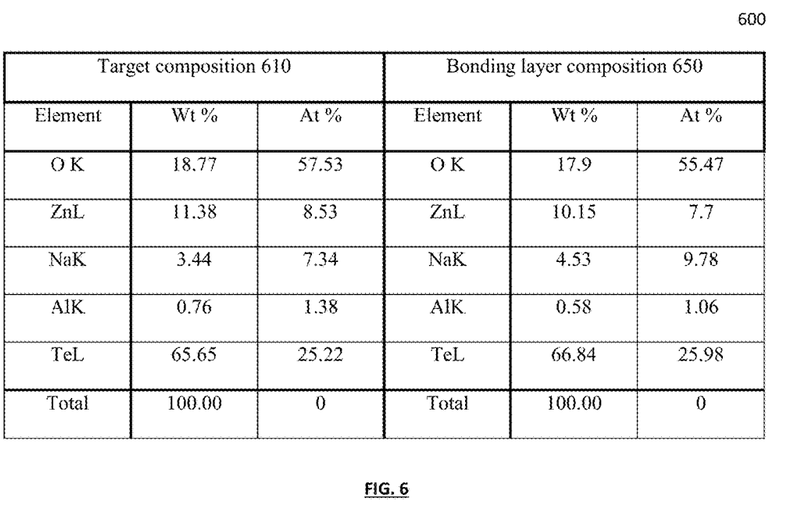
FIG. 6 shows a composition comparison between a target and a deposited bonding film.

Material released 370 from target 350 by activation source 340 may be advantageously composed of a material substantially similar to the material of the target. As an example, if target 350 is composed of a material Te—Zn—Al—Na-Oxide, the composition of the deposited bonding film 101 may also be substantially Te—Zn—Al—Na-Oxide. In a sample, following deposition 440, bonding film 101 composition was compared with target 350 composition before activation using Energy Dispersive Spectroscopy (EDS) on a Scanning Electron Microscope (SEM). Bonding film 101 and target 350 before activation were placed on a carbon platform and carbon coated prior to analysis by SEM. The conditions of the SEM were at 4-20 kV in high vacuum, using various detection modes such as backscattering electron imaging (BEI) and/or secondary electron imaging (SEI). As shown in FIG. 6, analysis 600 between target composition 610 and deposited bonding film composition 650 showed substantial similarities in composition when comparing atomic ratios and atomic weights.

During activation 420 of target 350, target 350 may be rotated continuously during the laser ablation. The activation source 350 may raster target 350, performing a pattern of scanned lines on target 350 such that the maximum area of target 350, is ablated as fresh material onto wavelength converter 110.

For the deposition 440 of bonding film 101 onto wavelength converter 110, wavelength converter 110 may be advantageously mounted to heating stage 380, by any means such as adhesive tape, clips, adhesive, bonding putty, or other available methods. The use of heating stage 380 advantageously allows for heating only wavelength converter 110 rather than the deposition chamber walls. This may aid in reducing unwanted gas-phase reactions that may lead to unwanted particle formation. Using heating stage 380 allows for stable heating of wavelength converter 110. Heating stage 380 may heat wavelength converter 110 directly or it may be composed of a material such as high temperature molybdenum or alloy onto which wavelength converter 110 may be placed.

Various activation sources 340 include, but are not limited to: a pulsed laser, an electron beam, an electrical heating element, high energy particles, an ion beam, or a high-energy laser. The activation source is chosen according to the deposition method chosen to deposit bonding film 101 onto wavelength converter 110 as previously discussed.

The deposition 440 conditions of the material onto the wavelength converter 110 may vary according to the deposition method used, however, in an example of conditions used for PLD, deposition may occur in an oxygen ambient at different oxygen partial pressures ranging from $1 \times 10^{-6}$ Torr to 1 Torr at room temperature.

To ensure an even distribution of bonding film 101 and aid in a uniform thickness of the deposited material, wavelength converter 110 may advantageously be rotated during deposition 440 to avoid a non-uniform distribution. The wavelength converter may be advantageously rotated at a rate faster than the target is rotated during deposition. The combination gives a uniform thickness of the deposited film. As an example, the bonding film 101 thickness may be predicted to range from 500-600 nm thick and 450 nm thick along the fracture surface.

In one embodiment, following the deposition 440 of bonding film 101 onto wavelength converter 110, the converter 110 with the deposited film may advantageously be annealed 450 to compensate for oxygen deficiency in the as-deposited films. Annealing is a process of slowly cooling objects, in this case the object may be hot glass, or bonding film 101. This is done to relieve internal stresses that have been introduced during deposition 440. One possible annealing method may include annealing 450 wavelength converter 110 with bonding film 101 at various temperatures in oxygen ambient in a furnace such as a Rapid Thermal Annealing (RTA) furnace. Temperatures may range from 300° C. to 700° C. for a length of 0.5-10 min. The annealing process 450 may be combined with first portion 480 of method 400, the second portion 490 of method 400, or alternatively, a third portion may be added to production method 400 of LARP assembly 100.

In an alternative embodiment, annealing 450 may not be necessary if the appropriate oxygen content is present in the bonding film and the step may be eliminated 411. Annealing 450 may be avoided if wavelength converter 110 is heated to a temperature during deposition 440 such that the temperature of wavelength converter 110 is the same as the bulk material, or target 350. The temperature which wavelength converter 110 would need to be heated is dependent on the composition of the bulk material. If the appropriate oxygen content and temperature of wavelength converter 110 is not present in bonding film 101, it may retain thermal stresses that may cause cracking when subjected to relatively small temperature changes or mechanical shock or stress. The deficiency may be bridged by annealing the sub-assembly 150.

Once the deposition of bonding film 101 is complete, second portion 490 of bonding method 400 may occur. This step involves applying substrate 120 to bonding film.

Material 370 deposited 440 onto wavelength converter 110 may create a bonding film 101 or layer. Substrate 120 may be applied 470 to the side of bonding film 101 opposite wavelength converter 110 immediately following deposition 440 or, alternatively, bonding film 101 may be cooled and reheated 460 to apply 470 substrate 120.

An embodiment of the LARP assembly 200 is shown in FIG. 2. Advantageously, dichroic layer 230 may be coated onto substrate 120 before applying 470 substrate 120 onto bonding film 101.

One method of applying 470 substrate 120 to bonding film 101 after it has cooled is to rapid heat 460 wavelength converter 110 and bonding film 101. Once bonding film 101 is heated 460 to a predetermined temperature, substrate 120 may be applied 470 to bonding film 101 by applying pressure to substrate 120. For example, wavelength converter 110 may be bonded to substrate 120 at approximately 500° C. and 18 N pressure.

In an alternative embodiment, bonding layer 101 may be deposited 440 onto substrate 120. Substrate 120 may have dichroic layer 230 intervening between deposited bonding layer 101 and substrate 120. Substrate 120 may be comprised of sapphire. Such bonding between dichroic sapphire and bonding layer 101, comprised of Te—Zn—Al—Na-Oxide or other glass material, may advantageously allow for an easier bonding. Wavelength converter 110 and intervening layers 160 may be applied in a manner similar to that discussed above.

Figure 5:
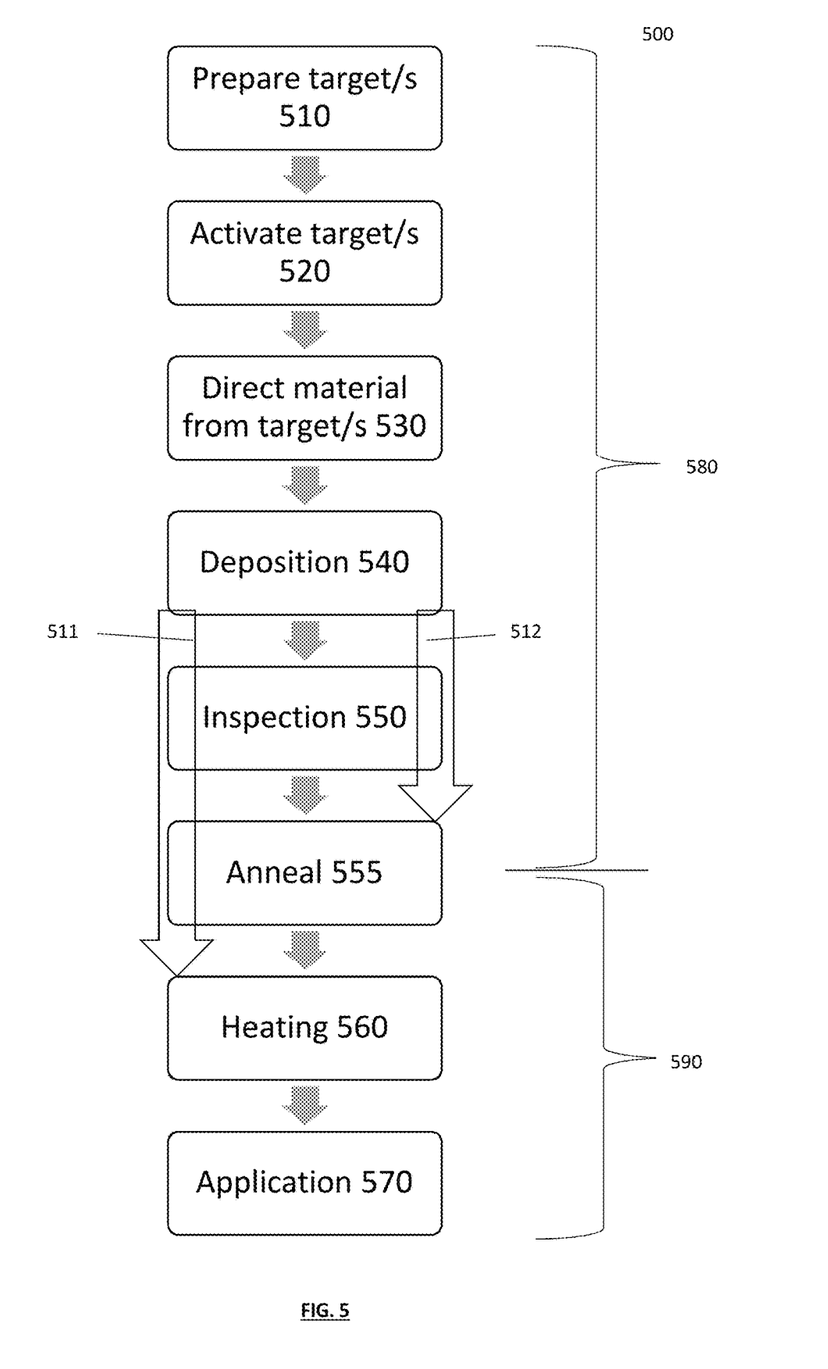
FIG. 5 shows a method for manufacturing a laser activating remote phosphor assembly.

FIG. 5 shows an embodiment of a method of manufacturing 500 a plurality of LARP assemblies 100, 200. The method is analogous to the method described above and shown in FIG. 4.

The manufacturing process of a plurality of LARP assemblies may be broken up into two parts. The first portion 580 may consist of the manufacture of a plurality of sub-assemblies 150. The second portion 590 may consist of applying 570 a plurality of substrates 120 to sub-assemblies 150. This advantageously prevents the necessity of shutting the assembly operation down due to difficulties in the dosing operation, as would be required using the previously mentioned drop-cast method. A plurality of sub-assemblies 150 may be completed simultaneously without needing to stop the operation for an individual sub-assembly 150.

Each sub-assembly 150 may be inspected 550 or verified for quality following production. Various aspects in bonding film 101 that may be inspected 550 may include, but are not limited to: bubbles, dark spots or cracking. If imperfections or substandard sub-assemblies 150 are found, the offending subassembly may be picked out, or removed from the assembly and production of LARP assembly 100, 200 before proceeding on to second portion 590 of LARP assembly 100, 200. Once quality has been inspected 550, the second part 590 of the manufacturing process may begin.

In manufacturing a plurality of LARP assemblies 100, 200, a sub-assembly 150 may be manufactured in a bulk production process where a plurality of sub-assemblies are manufactured or produced. A sub-assembly may consist of wavelength converter 110 and bonding film 101. However, as mentioned above, other intervening layers may be disposed between wavelength converter 110 and bonding film 101.

In preparing 510 target 350, a single target may be prepared as described above, or a plurality of targets may be prepared. Multiple factors may affect the quantity of targets needed. Some factors may include, but are not limited to: quantity of LARP sub-assemblies 150, deposition technique, necessary thickness of disposed layer, composition of the target material. The quantity of targets may be predetermined according to these factors.

Each target 350 may be activated 520 using activation source 340 such that the material of target/s 350 is released.

The activation process may occur through a variety of methods and may be analogous to those methods described previously.

The activation 520 is such that material 370 may be released from target/s 350 and directed 530 in the direction of the plurality of wavelength converters 110. Each wavelength converter 110 may be placed such that they are in the path of material 370 and are simultaneously or substantially simultaneously coated by material 370.

Material 370 released from target/s 350 is deposited 540 onto a major surface 140 of each of the wavelength converters creating a bonding film 101. Material 370 is directed 530 and deposited 440 is such a way that bonding film 101 covers substantially the same area on each wavelength converter 110 and has substantially the same thickness and uniformity on each wavelength converter 110. The deposition method of 500 is substantially similar to that of 400.

Once bonding film 101 is deposited onto a plurality of wavelength converters 110, the first portion 580 of LARP assembly manufacture 500 is complete. For the second portion 590 of manufacturing process 500 individual substrates 120 may be applied 570 to the side of bonding film 101 opposite each wavelength converter 110 creating a LARP assembly.

Alternatively, before applying individual substrate 120, wavelength converters 110 with the deposited bonding film 101 may be annealed in a manner similar to method 400 described above. The annealing process 555 may be combined with first portion 580 of method 500, the second portion 590 of method 500, or alternatively, a third portion may be added to production method 500 of manufacturing a plurality of LARP assembly 100.

The steps of inspecting 550 sub-assemblies and annealing 555 sub-assemblies 150 may be considered unnecessary to the manufacture process 500. In such case, the process may eliminate one 512 or both 511 of those steps.

Substrate 120 may be applied immediately following deposition 540 before bonding film 101 cools to a temperature where bonding may not occur. Or, alternatively, bonding film may be cooled for inspection 550 of wavelength converters 110 with deposited 540 bonding film 101. For inspection 550, manufacturing process 500 may be paused without causing undue delay in the manufacturing process. Following inspection 550, wavelength converters 110 may be rapid heated 560 in mass or individually. Sub-assemblies 150 may be heated to a predetermined temperature according to the composition of bonding film 101. Once the predetermined temperature has been reached, substrate 120 may be applied 570.

Substrate 120 may be applied 570 to each wavelength converter in a manner similar to the manufacture of an individual LARP assembly 100.

Figure 7A:
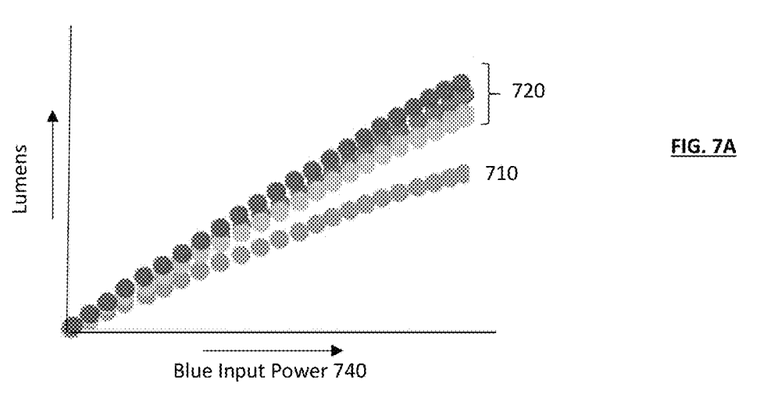
FIGS. 7A and 7B shows a comparison between deposited bonding film and deposited substandard film.
Figure 7B:
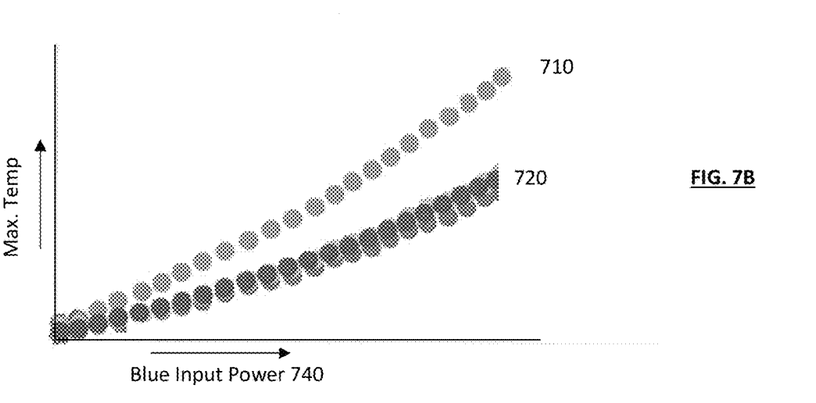

FIGS. 7A and 7B show a comparison of a standard, or desirable, LARP assembly 100, 200 with a sub-standard LARP assembly in which imperfections are evidenced in bonding film 101. In the case of FIGS. 7A and 7B, the offending bonding film contained a dark spot on the surface of the film. FIG. 7A shows a power series analysis of the effect of a dark spot on the brightness of the LARP assembly when irradiated with blue input power 740. Dark spot assembly 710 requires significantly more power to and is significantly darker than standard LARP assemblies 720. Additionally, as shown in FIG. 7B, which shows the thermal measurements, the dark spot assembly 710 exhibits more temperature output the higher the power of blue input power 740 goes. The temperature of LARP assemblies 720 is significantly lower at given blue input powers 740. This emphasizes the advantageous feature of breaking the manufacture of a plurality of LARP assemblies into two parts. Sub-standard LARP sub-assemblies may be easily picked out of an array with either a visual analysis or a more intensive analysis before assembling a complete LARP assembly. This has the advantageous feature of speeding up the process of assembly and eliminating wasted materials.

While the disclosed embodiments have been particularly shown and described with reference to specific embodiments, it should be understood by those skilled in the art various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

What is claimed is:

1. A method for producing a laser activated remote phosphor (LARP) sub-assembly, comprising: preparing a target composed of a material; activating the target such that the material is released from the target; directing the material released from the target in the direction of a wavelength converter, depositing the material released from the target onto a major surface of the wavelength converter creating a bonding film, applying a substrate to the bonding film on a side opposite the wavelength converter to form a LARP assembly, and coating the substrate with a dichroic layer before applying the substrate to the bonding film.

2. The method of claim 1, further comprising vaporizing at least a portion of the material from the target using an activation source; wherein the material released from the target by the activation source is composed of a material substantially similar to the material of the target.

3. The method of claim 1, wherein the bonding film is deposited directly onto the wavelength converter.

4. The method of claim 1, wherein the bonding film is deposited onto an intervening layer on the wavelength converter.

5. The method of claim 1, further comprising mounting the wavelength converter to a heating stage before depositing the material.

6. The method of claim 1, further comprising annealing the wavelength converter with the deposited bonding film.

7. The method of claim 1, further comprising applying the substrate to the bonding film wherein the dichroic layer is positioned between the bonding film and the substrate.

8. The method of claim 1, wherein the wavelength converter with the deposited bonding film are heated before applying the substrate.

9. A method of manufacturing a plurality of laser activated remote phosphor (LARP) sub-assemblies, comprising: preparing at least one target composed of a material; activating the at least one target such that the material is released from the at least one target; directing the material released from the at least one target in the direction of a plurality of wavelength converters; depositing the material released from the at least one target onto a major surface of each of the respective wavelength converters creating a bonding film of each of the wavelength converters respectively, applying individual substrates to the bonding film on a side opposite to the each of the respective wavelength converters to form a plurality of LARP assemblies, and coating the individual substrates with a dichroic layer, and applying the individual substrates to the bonding film wherein the dichroic layer is positioned between the bonding film and the individual substrates.

10. The method of claim 9, further comprising depositing the bonding film on the each of the respective wavelength converters substantially simultaneously.

11. The method of claim 9, further comprising annealing the plurality of wavelength converters with the deposited bonding film.

12. The method of claim 9, wherein the each of the respective wavelength converters with the deposited bonding film are heated before applying the individual substrates.

13. The method of claim 9, further comprising inspecting the plurality of wavelength converters with the bonding film following deposition for substandard sub-assemblies and eliminating the substandard sub-assemblies.

14. The method of claim 9, further comprising heating the plurality of wavelength converters with the bonding film to a predetermined temperature before applying the individual substrates and applying the individual substrates to the bonding film when the predetermined temperature has been reached.

15. A laser-activated remote phosphor (LARP) sub-assembly comprising: a wavelength converter; a bonding film deposited onto a major surface of the wavelength converter using a thin film deposition method comprising activating a target composed of a material and releasing the material from the target; wherein the bonding film is composed of a low temperature glass composition of substantially uniform thickness; wherein the bonding film is substantially free from thermal and mechanical stresses; and further comprising a substrate coated with a dichroic layer, which is bonded to the wavelength converter via the bonding film which forms a LARP assembly, wherein the substrate is bonded to a side of the bonding film opposite the wavelength converter.

* * * * *